(12) United States Patent
Babich et al.

(10) Patent No.: US 7,223,517 B2
(45) Date of Patent: May 29, 2007

(54) LITHOGRAPHIC ANTIREFLECTIVE HARDMASK COMPOSITIONS AND USES THEREOF

(75) Inventors: Katherina Babich, Chappaqua, NY (US); Arpan P. Mahorowala, Bronxville, NY (US); David R. Medeiros, Ossining, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 10/634,667

(22) Filed: Aug. 5, 2003

(65) Prior Publication Data

US 2005/0031964 A1    Feb. 10, 2005

(51) Int. Cl.
*G03C 7/004* (2006.01)
(52) U.S. Cl. .................... 430/270.1; 430/311
(58) Field of Classification Search ............. 430/270.1, 430/5, 311
See application file for complete search history.

(56) References Cited

U.S. PATENT DOCUMENTS

| | | | | |
|---|---|---|---|---|
| 4,221,688 | A * | 9/1980 | Johnson et al. | 524/251 |
| 4,371,605 | A | 2/1983 | Renner | 430/280.1 |
| 4,626,556 | A * | 12/1986 | Nozue et al. | 522/99 |
| 5,085,893 | A * | 2/1992 | Weiss et al. | 427/96.2 |
| 5,674,937 | A * | 10/1997 | Berg et al. | 524/831 |
| 5,877,080 | A * | 3/1999 | Aoi et al. | 438/622 |
| 5,994,459 | A * | 11/1999 | Berg et al. | 524/837 |
| 6,087,064 | A * | 7/2000 | Lin et al. | 430/270.1 |
| 6,100,417 | A * | 8/2000 | Lichtenhan et al. | 556/460 |
| 6,187,505 | B1 * | 2/2001 | Lin et al. | 430/270.1 |
| 6,268,457 | B1 | 7/2001 | Kennedy et al. | 528/39 |
| 6,344,305 | B1 * | 2/2002 | Lin et al. | 430/270.1 |
| 6,365,765 | B1 | 4/2002 | Baldwin et al. | 556/440 |
| 6,368,400 | B1 | 4/2002 | Baldwin et al. | 106/481 |
| 6,420,084 | B1 | 7/2002 | Angelopoulos et al. | 430/270.1 |
| 6,506,497 | B1 | 1/2003 | Kennedy et al. | 428/447 |
| 6,517,958 | B1 * | 2/2003 | Sellinger et al. | 428/90 |
| 6,521,699 | B2 * | 2/2003 | Feder et al. | 524/588 |
| 6,569,932 | B2 * | 5/2003 | Hsiao et al. | 524/269 |

(Continued)

FOREIGN PATENT DOCUMENTS

EP    1 271 634 A2    2/2003

OTHER PUBLICATIONS

Fehere, Frank "Polyhedral Oligosilsesquioxanes and Heterosilsesquoxanes" Separtment of Chemistry, University of California; Copyright 1998 Gelest, Inc., p. 43-49.*

(Continued)

*Primary Examiner*—Amanda Walke
(74) *Attorney, Agent, or Firm*—Ryan, Mason & Lewis, LLP; Daniel P. Morris, Esq.

(57) ABSTRACT

Compositions and techniques for the processing of semiconductor devices are provided. In one aspect of the invention, an antireflective hardmask composition is provided. The composition comprises a fully condensed polyhedral oligosilsesquioxane, $\{RSiO_{1.5}\}_n$, wherein n equals 8; and at least one chromophore moiety and transparent moiety. In another aspect of the invention, a method for processing a semiconductor device is provided. The method comprises the steps of: providing a material layer on a substrate; forming an antireflective hardmask layer over the material layer. The antireflective hardmask layer comprises a fully condensed polyhedral oligosilsesquioxane, $\{RSiO_{1.5}\}_n$, wherein n equals 8; and at least one chromophore moiety and transparent moiety.

29 Claims, 1 Drawing Sheet

U.S. PATENT DOCUMENTS 6,653,045 B2 * 11/2003 Angelopoulos et al. .. 430/270.1
6,660,823 B1 * 12/2003 Lichtenhan et al. .......... 528/37
6,664,024 B1 * 12/2003 Nguyen et al. .......... 430/280.1
6,759,460 B2 * 7/2004 Kamo et al. ................. 524/100
6,767,930 B1 * 7/2004 Svejda et al. ................ 521/134
6,803,171 B2 * 10/2004 Gronbeck et al. ....... 430/270.1
6,821,718 B2 * 11/2004 Angelopoulos et al. ..... 430/325
6,916,543 B2 * 7/2005 De et al. .................... 428/447
2002/0182541 A1 * 12/2002 Gonsalves ............... 430/287.1
2004/0067633 A1 * 4/2004 Tsai et al. ................... 438/622
2005/0107541 A1 * 5/2005 Bening ....................... 525/242

OTHER PUBLICATIONS

Feher, F.J., "Polyhedral Oligosilsesquioxanes and Heterosilsesquioxanes," Gelest, Inc., pp. 43-59.

* cited by examiner

LITHOGRAPHIC ANTIREFLECTIVE HARDMASK COMPOSITIONS AND USES THEREOF

FIELD OF THE INVENTION

The present invention relates to semiconductor devices and, more particularly, to the processing of semiconductor devices.

BACKGROUND OF THE INVENTION

In the microelectronics industry, as well as in other industries involving construction of microscopic structures, e.g., micromachines and magnetoresistive heads, there is a desire to further reduce the size of structural features. In the microelectronics industry in particular, while the size of microelectronic devices is being reduced, a greater amount of circuitry for a given chip size is being required.

Effective lithographic techniques are essential to reducing the size of structural features. Lithography impacts the manufacture of microscopic structures, not only in terms of directly imaging patterns on the desired substrate, but also in terms of making masks typically used in such imaging.

Most lithographic processes use an antireflective coating (ARC) to minimize the reflectivity between an imaging layer, such as a radiation-sensitive resist material layer, and an underlayer to enhance resolution. However, these ARC materials impart poor etch selectivity to the imaging layer due to the layers' similar elemental compositions. Therefore, during etching of the ARC after patterning, a lot of the imaging layer is also consumed, which may have been needed for additional patterning during subsequent etch steps.

In addition, for some lithographic techniques, the radiation-sensitive resist material employed does not provide resistance to subsequent etching steps sufficient enough to enable effective transfer of the desired pattern to the layer underlying the radiation-sensitive resist material. In many instances, a hardmask layer is used, for example, where an ultrathin radiation-sensitive resist material is used, where the underlying layer to be etched is thick, where a substantial etching depth is required, where it is desirable to use certain etchants for a given underlying layer, or any combination of the above. The hardmask layer serves as an intermediate layer between the patterned radiation-sensitive resist material and the underlying layer to be patterned. The hardmask layer receives the pattern from the patterned radiation-sensitive resist material layer and transfers the pattern to the underlying layer. The hardmask layer should be able to withstand the etching processes required to transfer the pattern.

While many materials useful as ARC compositions are known, there is a need for improved ARC compositions with high etch selectivity to the radiation-sensitive resist material, to the hardmask layer and to the underlying layer. Further, many of the known ARCs are difficult to apply to the substrate, e.g., applying these ARCs may require the use of chemical vapor deposition, physical vapor deposition, special solvents, high temperature baking or any combination of the above.

It would be desirable to perform lithographic techniques with a high etch selectivity and a sufficient resistance to multiple etchings. These lithographic techniques would enable production of highly detailed semiconductor devices.

SUMMARY OF THE INVENTION

The present invention provides compositions and techniques for the processing of semiconductor devices. In one aspect of the invention, an antireflective hardmask composition is provided. The composition comprises a fully condensed polyhedral oligosilsesquioxane, $\{RSiO_{1.5}\}_n$, wherein n equals 8; and an equivalent number of at least one chromophore moiety and transparent moiety. The composition may comprise any combination of an acid generator, a crosslinking component and an additional crosslinking component.

In another aspect of the invention, a method for processing a semiconductor device is provided. The method comprises the steps of: providing a material layer on a substrate; and forming an antireflective hardmask layer over the material layer. The antireflective hardmask layer comprises a fully condensed polyhedral oligosilsesquioxane, $\{RSiO_{1.5}\}_n$, wherein n equals 8; and at least one chromophore moiety and transparent moiety. The method may further comprise the steps of: forming a radiation-sensitive imaging layer over the antireflective layer; patternwise exposing the radiation-sensitive imaging layer to radiation thereby creating a pattern of radiation-exposed regions in the imaging layer; selectively removing portions of the radiation-sensitive imaging layer and the antireflective hardmask layer to expose portions of the material layer; and etching the exposed portions of the material layer, thereby forming a patterned material feature on the substrate.

A more complete understanding of the present invention, as well as further features and advantages of the present invention, will be obtained by reference to the following detailed description and drawing.

DETAILED DESCRIPTION OF PREFERRED EMBODIMENTS

Figure 1:
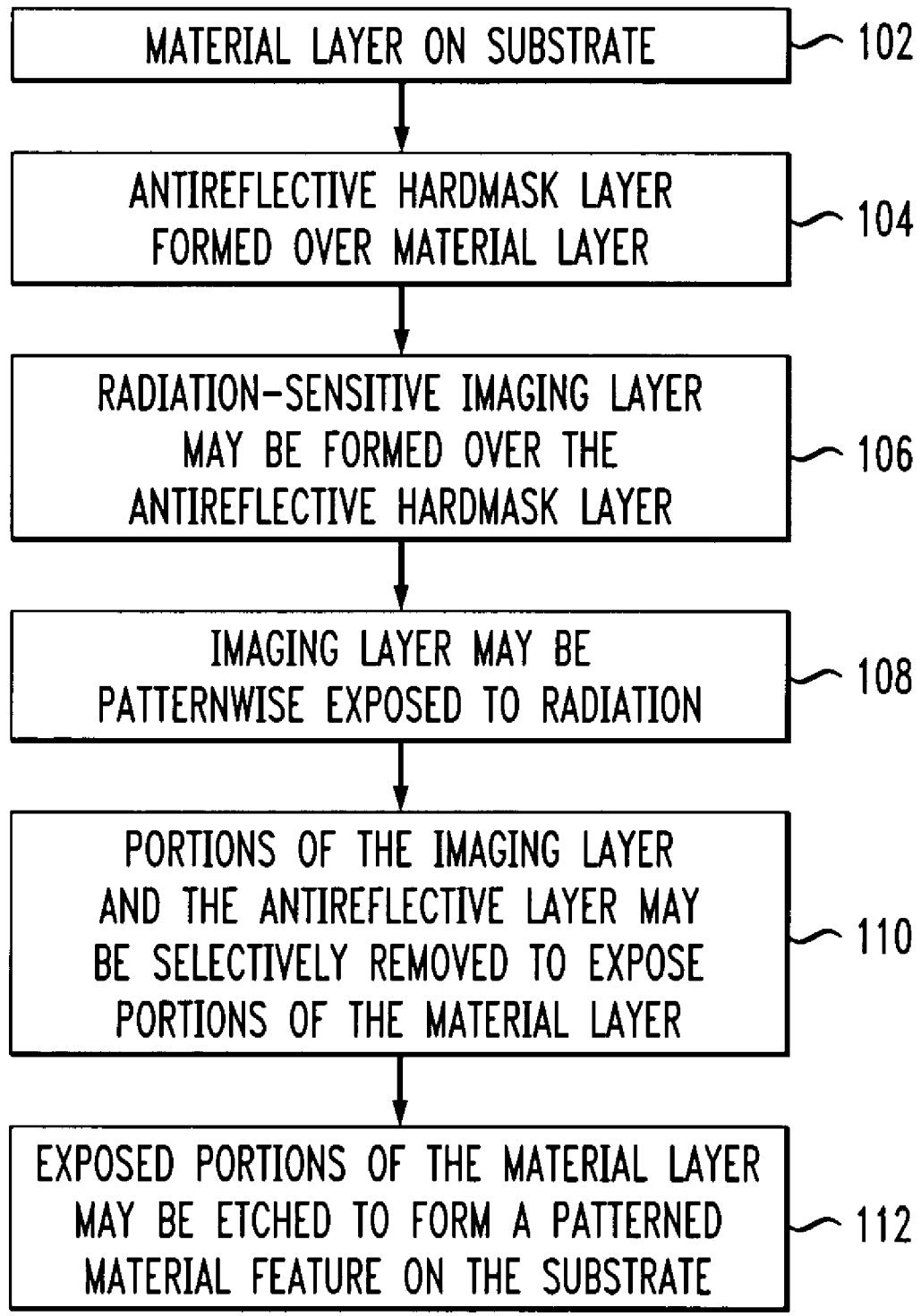
FIG. 1 is a flow chart illustrating an exemplary technique for processing a semiconductor device according to an embodiment of the present invention.

An antireflective hardmask composition (hereinafter "the composition") is disclosed herein. The composition comprises a fully condensed polyhedral oligosilsesquioxane (POSS) material. The fully condensed POSS material may comprise the units $\{RSiO_{1.5}\}_n$, wherein n equals 6 to 12.

In an exemplary embodiment, the fully condensed POSS material is selected from a cubic moiety of the formula $\{RSiO_{1.5}\}_n$, wherein n equals 8 and comprising SiO bonds. This fully condensed POSS material should have solution and film-forming characteristics conducive to forming a layer by conventional spin-coating.

The fully condensed POSS material may have either of General Structures I and II shown below:

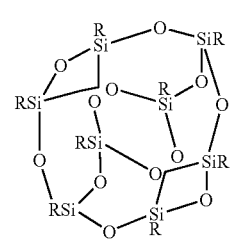

I

-continued

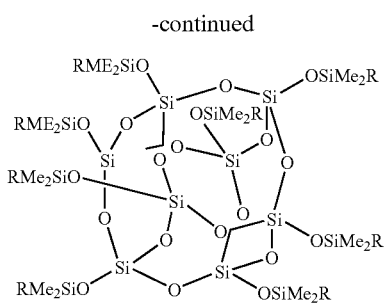

II wherein R comprises a chromophore moiety and/or a transparent moiety. The R group may further serve as a crosslinking component. The R group can crosslinking component with or without an additional crosslinking component depending on the chemical nature of the R group. An additional crosslinking component is described below. In some instances, multiple functional moieties may be present on the same POSS unit. Thus, for example, a chromophore moiety and a transparent moiety may be present on the same POSS unit. It may be desirable to blend POSS units containing a chromophore moiety, a transparent moiety and/or a crosslinking component.

Generally, all fully condensed POSS materials are suitable for antireflective hardmask applications since the absence or minimum inclusion of SiOH groups enhances the stability of the POSS material for storage. However, General Structures I and II, shown above, are preferred. As shown in General Structure II, the POSS material may comprise OSiMe$_2$ units on each corner of the cubic moiety.

The antireflective hardmask composition of the present invention may comprise, on a solids basis, from about 50 weight percent (wt. %) to about 98 wt. % POSS material. For example, the composition may comprise, on a solids basis, from about 70 wt. % to about 80 wt. % POSS material.

Suitable chromophore moieties include those chromophore moieties which can be grafted onto an SiO moiety of the POSS material, have suitable radiation absorption characteristics and do not adversely affect the performance of the antireflective hardmask composition, or any overlying radiation-sensitive layers, as will be described in detail below. Suitable chromophore moieties include, but are not limited to, phenyl, chrysenes, pyrenes, fluoranthrenes, anthrones, benzophenones, thioxanthones, and anthracenes. Anthracene derivatives, such as those described in Renner, U.S. Pat. No. 4,371,605, "Photopolymerizable Compositions Containing N-hydroxyamide and N-hydroxyimide Sulfonates," the disclosure of which is incorporated by reference herein, may also be used. 9-Anthracene methanol is a preferred chromophore for 248 nanometer (nm) applications. The chromophore moiety preferably does not contain nitrogen, except for possibly deactivated amino nitrogen such as in phenol thiazine. For 193 nm radiation, non-aromatic compounds containing unsaturated carbon bonds, e.g., carbon to carbon double bonds, are also suitable chromophores. For 157 nm radiation, compounds containing saturated carbon to carbon bonds can act as chromophores.

The chromophore moieties may be chemically attached to the SiO component of a POSS unit by acid-catalyzed O-alkylation or acid-catalyzed C-alkylation, such as by Friedel-Crafts alkylation. Alternatively, the chromophore moiety may be attached to a POSS unit by an esterification mechanism. In an exemplary embodiment, from about five percent to about 40 percent of the POSS units contain chromophore moieties. The sites for attachment of the chromophore moieties may be an aromatic group such as a hydroxybenzyl or hydroxymethylbenzyl group. Alternatively, the chromophore moieties may be attached to a POSS unit by reaction with other moieties such as cyclohexanol or another alcohol. The reaction used to attach the chromophore moieties may comprise an esterification of an alcohol (OH) group.

Suitable transparent moieties may vary depending on the wavelength or character of the imaging radiation. In the cases of 193 or 157 nm imaging radiation, the transparent moieties preferably comprise hydrogen and/or organic groups (C$_1$ or higher), substantially free of unsaturated carbon to carbon bonds. For example, a suitable transparent moiety for 193 nm applications is an alcohol or an epoxide. In the case of 157 nm imaging radiation, transparent moieties containing fluorine may be desirable. The amount of transparent moieties is preferably balanced with the amount of chromophore to provide a desired combination of energy absorption and antireflection. Thus in an exemplary embodiment, the composition comprises an equivalent number of chromophore moieties and transparent moieties.

As mentioned above, the R group can function as a crosslinking component. The crosslinking component can crosslink POSS units in a reaction catalyzed by a generated acid and/or by heating. The R group can function as a crosslinking component with or without an additional crosslinking component. Suitable R group crosslinking components include, but are not limited to, epoxides or alcohols, such as, aromatic alcohols, including, hydroxybenzyl, phenol, hydroxymethylbenzyl or cycloaliphatic alcohols, including, cyclohexanoyl. Alternatively, non-cyclic alcohols, such as fluorocarbon alcohols, aliphatic alcohols, amino groups, vinyl ethers may be employed.

Generally the chromophore moiety, transparent moiety and/or crosslinking component can be attached to the SiO unit of the POSS material by a hydrosilation reaction or by choosing appropriately functionalized precursors (RSiOR$_3$ or RSiCl$_3$) before the POSS synthesis. See F. J. Feher, *Polyhedral Oligosilsesquioxanes and Heterosilsesquioxanes*, Gelest Catalog, 43–59 (1998), the disclosure of which is incorporated by reference herein.

Examples of suitable POSS materials with R groups functioning as crosslinking components include those shown in the scheme below:

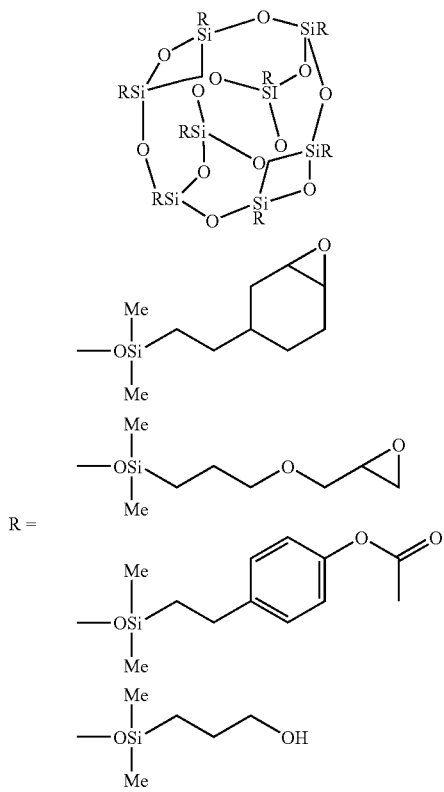

The antireflective hardmask composition of the present invention may comprise, on a solids basis, less than or equal to about 50 wt. % crosslinking component. For example, the composition may comprise, on a solids basis, from about five wt. % to about 25 wt. % crosslinking component.

The composition may further comprise an additional crosslinking component that can be reacted with a POSS unit in a reaction catalyzed by a generated acid and/or by heating. Generally, the additional crosslinking component used in the composition may be any suitable crosslinking agent known in the negative photoresist art which is otherwise compatible with the other selected components of the composition. The additional crosslinking component acts to crosslink POSS units in the presence of a generated acid. Additional crosslinking components include, but are not limited to, glycoluril compounds, such as, tetramethoxymethyl glycoluril, methylpropyltetramethoxymethyl glycoluril and methylphenyltetramethoxymethyl glycoluril, available under the POWDERLINK trademark from Cytec Industries, 2,6-bis(hydroxymethyl)-p-cresol compounds such as those found in Masaaki, Japanese Patent Application JP1293339A2, "Photoresist Compositions," the disclosure of which is incorporated by reference herein, etherified amino resins, for example, methylated melamine resins or butylated melamine resins (N-methoxymethyl-melamine or N-butoxymethyl-melamine), methylated glycolurils and butylated glycolurils, for example as can be found in Kirchmayr, Canadian Patent 1204547, "Curable Composition Based On an Acid-Curable Resin, and Process for Curing this Resin," the disclosure of which is incorporated by reference herein. Other crosslinking agents such as bisepoxies or bis-phenols, e.g., bisphenol-A, may also be used.

Combinations of crosslinking agents may be used. In some cases, e.g., where the reactive group is an epoxide, additional crosslinkers may not be necessary.

In some cases crosslinking can be achieved by irradiation of the material with electron beam irradiation (hereinafter "e-beam"). In these cases, the addition of an additional crosslinking component and an acid generator and/or heating are optional.

Suitable acid generators include acid generating compounds that liberate acid upon thermal treatment, e.g., thermal acid generators. A variety of known thermal acid generators may be employed, such as, 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in Sinta et al., U.S. Pat. No. 5,886,102, "Antireflective Coating Compositions" (hereinafter "Sinta") and in Pavelchek et al., U.S. Pat. No. 5,939,236, "Antireflective Coating Compositions Comprising Photoacid Generators," (hereinafter "Pavelchek"), the disclosures of which are incorporated by reference herein. If desired, a radiation-sensitive acid generator may be employed as an alternative to, or in combination with, a thermal acid generator. Examples of suitable radiation-sensitive acid generators are described in Sinta and Pavelchek. Other radiation-sensitive acid generators known in the resist art may also be used as long as they are compatible with the other components of the composition. Where a radiation-sensitive acid generator is used, the cure, e.g., crosslinking, temperature of the composition may be reduced by the application of appropriate radiation to induce acid generation which in turn catalyzes the crosslinking reaction. Even if a radiation-sensitive acid generator is used, it is preferable to thermally treat the composition to accelerate the crosslinking process, for example, in the case of production line fabrication.

The antireflective hardmask composition of the present invention may comprise, on a solids basis, from about one wt. % to about 20 wt. % acid generator. For example, the composition may comprise, on a solids basis, from about one wt. % to about 15 wt. % acid generator.

The composition may be used in combination with any desired resist material to form a lithographic structure. Preferably, the resist is imageable with shorter wavelength ultraviolet radiation, e.g., less than 200 nm wavelength, or with e-beam radiation. Examples of suitable resist materials are described in Bucchignano et al., U.S. Pat. No. 6,037,097, "E-beam Application to Mask Making Using New Improved KRS Resist System," the disclosure of which is incorporated by reference herein.

The composition will typically contain a solvent prior to application to the desired substrate. The solvent may be any solvent conventionally used with resists which otherwise does not have any excessively adverse impact on the antireflective hardmask performance of the composition. Suitable solvents include, but are not limited to, propylene glycol monomethyl ether acetate, cyclohexanone and ethyl lactate. The amount of solvent in the composition for application to a substrate should be sufficient to achieve a solids content of about five wt. % to about 20 wt. %. Higher solids content formulations will generally yield thicker coating layers. The composition may further contain minor amounts of auxiliary components, e.g., base additives, as may be known in the art.

The composition can be prepared by combining the POSS material, crosslinking component and acid generator and any other desired ingredients using conventional methods.

The formation of an antireflective hardmask layer using the composition is described below.

The antireflective hardmask layers are useful for lithographic processes used in the manufacture of integrated circuits on semiconductor substrates. For example, the antireflective hardmask layers are especially useful for lithographic processes using 248 nm, 193 nm, 157 nm, x-ray, e-beam or other imaging radiation. Thus, further disclosed herein is a method for processing a semiconductor device, as shown in FIG. 1.

Semiconductor lithographic applications generally involve transfer of a pattern to a material layer on the semiconductor substrate, as shown in step 102 of FIG. 1. The material layer may be a metal conductor layer, a ceramic insulator layer, a semiconductor layer or other material layer depending on the stage of the manufacture process and the desired material set for the end product. The composition may be formed into an antireflective hardmask layer and applied directly over the material layer to be patterned, preferably by spin-coating, as shown in step 104 of FIG. 1. The composition is then baked to remove the solvent and to cure, e.g., crosslink, the composition.

The composition may be formed into antireflective hardmask layers on a substrate by spin-coating followed by baking to achieve crosslinking and solvent removal. The baking is conducted at about 250 degrees centigrade (° C.) or less. For example, baking is conducted at a temperature of from about 150° C. to about 220° C. The baking time may be varied depending on the layer thickness and baking temperature.

The thickness of the antireflective hardmask layer may vary depending on the desired function. For typical applications, the thickness of the antireflective hardmask layer is from about 0.03 micrometers (μm) to about 5.0 μm.

If desired, the composition may also be used as a dielectric material in a similar manner to conventional spin-on glass materials. The antireflective hardmask layer resists lateral etch acting as a hardmask even at thin film thickness traditionally associated with organic antireflective layers.

A radiation-sensitive imaging layer can then be applied, either directly or indirectly, over the cured composition, as shown in step 106 of FIG. 1. The radiation-sensitive imaging layer may be applied using spin-coating techniques. The substrate with the material layer, the antireflective hardmask layer and the radiation-sensitive imaging layer may then be heated, e.g., pre-exposure baked, to remove the solvent and improve the coherence of the radiation-sensitive imaging layer. The radiation-sensitive imaging layer should be as thin as possible while still being substantially uniform and sufficient to withstand subsequent processing, such as reactive ion etching, to transfer the lithographic pattern to the underlying substrate material layer. The pre-exposure bake step is preferably conducted for about ten seconds to about 900 seconds. For example, the duration of the pre-exposure bake may be from about 15 seconds to about 60 seconds. The pre-exposure bake temperature may vary depending on the glass transition temperature of the radiation-sensitive imaging layer.

After solvent removal, the radiation-sensitive imaging layer is then patternwise-exposed to the desired radiation, e.g., 193 nm ultraviolet radiation, as shown in step 108 of FIG. 1. Where scanning particle beams, such as an electron beam, are used, patternwise exposure may be achieved by scanning the beam across the substrate and selectively applying the beam in the desired pattern. More typically, where wavelike radiation in used, such as 193 m ultraviolet radiation, the patternwise exposure is conducted through a mask which is placed over the radiation-sensitive imaging layer. For 193 nm UV radiation, the total exposure energy is less than or equal to about 100 millijoules per square centimeter (millijoules/cm$^2$). For example, the exposure energy may be less than or equal to about 50 millijoules/cm$^2$. Further, the exposure energy may be from about 15 millijoules/cm$^2$ to about 30 millijoules/cm$^2$.

After the desired patternwise exposure, the radiation-sensitive imaging layer is typically baked, i.e., post-exposure baked, to further complete the acid-catalyzed reaction and to enhance the contrast of the exposed pattern. The post-exposure bake is conducted at a temperature of from about 60° C. to about 175° C. For example, the post-exposure bake is conducted at a temperature of from about 90° C. to about 160° C. The post-exposure bake is conducted for a duration of from about 30 seconds to about 300 seconds.

After post-exposure bake, the radiation-sensitive imaging layer with the desired pattern is obtained, e.g., developed, by contacting the radiation-sensitive imaging layer with an alkaline solution which selectively dissolves the areas of the radiation-sensitive imaging layer which were exposed to the radiation, as shown in step 110 of FIG. 1. Preferred alkaline solutions, e.g., developers, include aqueous solutions of tetramethyl ammonium hydroxide. The resulting lithographic structure on the substrate is then typically dried to remove any remaining developer solvent.

The pattern from the radiation-sensitive imaging layer may then be transferred to the exposed portions of the antireflective hardmask layer by etching with tetrafluoromethoane ($CF_4$), or other suitable etchant, using known techniques. The portions of the antireflective hardmask layer may then be removed, as shown in step 110 of FIG. 1.

The exposed underlying material layer to be patterned may then be etched, as shown in step 112 of FIG. 1, using an etchant appropriate to that material. For example, when the material layer comprises a metal, such as chromium (Cr), a chlorine/oxygen combination ($Cl_2/O_2$) may be used as a dry etchant.

Once the pattern transfer has taken place, any remaining radiation-sensitive imaging layer and antireflective hardmask layer may be removed using conventional stripping techniques. If the antireflective hardmask layer is being used strictly as a hardmask layer, the composition may be removed using a tetrafluoromethane/oxygen ($CF_4/O_2$) plasma.

Thus, the composition and resulting lithographic structures can be used to create patterned material layer structures such as metal wiring lines, holes for contacts or vias, insulation sections, such as, damascene trenches or shallow trench isolation, trenches for capacitor structures, such as those that might be used in the design of integrated circuit devices. The compositions are especially useful in the context of creating patterned layers of oxides, nitrides, polysilicon, and/or chrome.

Examples of general lithographic processes wherein the composition of the present invention may be useful are disclosed in Douglas, U.S. Pat. No. 4,855,017, "Trench Etch Process for a Single-Wafer RIE Dry Etch Reactor," Bronner et al., U.S. Pat. No. 5,362,663, "Method of Forming Double Well Substrate Plate Trench DRAM Cell Array," Akiba et al., U.S. Pat. No. 5,429,710, "Dry Etching Method," Nulty, U.S. Pat. No. 5,562,801, "Method of Etching an Oxide Layer," Golden et al., U.S. Pat. No. 5,618,751, "Method of Making Single-Step Trenches Using Resist Fill Recess," Chan et al., U.S. Pat. No. 5,744,376, "Method of Manufacturing Copper Interconnect With Top Barrier Layer," Yew et al., U.S. Pat. No. 5,801,094, "Dual Damascene Process," Shanmugham, U.S. Pat. No. 5,821,469, "Device for Securing Cables in a Telecommunications System," Komblit, U.S. Pat. No. 5,948,570, "Process for Dry Lithographic Etching," the disclosures of which are incorporated by reference herein. Other examples of pattern transfer processes are described in W. MOREAU, SEMICONDUCTOR LITHOGRAPHY, PRINCIPLES, PRACTICES, AND MATERIALS, ch. 12–13 (1988), the disclosure of which is incorporated by reference herein. While exemplary lithographic processes are described and referenced herein, it should be understood that the present invention should not limited to any particular lithographic technique or device structure.

Further disclosed herein is a patterned lithographic structure. The patterned lithographic structure comprises: a substrate; a material layer over the substrate; a patterned antireflective hardmask layer over the material layer, the patterned antireflective hardmask layer comprising the composition; and a patterned radiation-sensitive imaging layer over the antireflective hardmask layer.

Although illustrative embodiments of the present invention have been described herein, it is to be understood that the invention is not limited to those precise embodiments, and that various other changes and modifications may be made by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLES

Example 1

The POSS materials Octakis{(glycidoxypropyl)dimethylsiloxy}silsesquioxane, Octakis{(ethylcyclohexylpropyl)dimethylsiloxy}silsesquioxane, Octakis{(propanol)dimethylsiloxy}silsesquioxane and Octakis{(ethylphenylacetate)dimethylsiloxy}silsesquioxane were obtained from TAL Materials, Inc.

Example 2

Formulation

The desired POSS material from Example 1 was dissolved in propylene glycol monomethyl ether acetate (PGMEA) or ethyl lactate in concentrations of 12 percent by weight to the solvent to 14 percent by weight to the solvent. A crosslinking agent tetramethoxymethyl glycoluril, available from DayChem, in a concentration of eight parts by weight relative to POSS and di(t-butylphenyl)iodoniumperfluorobutylsulfonate (DtBPI-PFBuS) in a concentration of four parts by weight relative to POSS were added to the solution.

Example 3

Film Formation and Optical Properties

Formulations POSS A, POSS B, POSS C and POSS D comprising Octakis{(glycidoxypropyl)dimethylsiloxy}silsesquioxane, Octakis{(ethylcyclohexylpropyl)dimethylsiloxy}silsesquioxane, Octakis{(propanol)dimethylsiloxy}silsesquioxane and Octakis{(ethylphenylacetate)dimethylsiloxy}silsesquioxane, respectively, prepared as described in Example 2, were spin coated onto a 200 millimeter silicon wafer at 3,000 revolutions per minute for 60 seconds. The film thicknesses ranged from 1,700 to 2,500 angstroms. The spin cast film was cured at 200° C. for 60 seconds. The optical constants, the index of refraction n and the extinction coefficient k at 193 nm, were measured using an n&k Analyzer manufactured by n&k Technology, Inc.

The optical properties of the films for 193 nm radiation were as follows:

| Film POSS | n | K |
|---|---|---|
| POSS A | 1.611 | 0.030 |
| POSS B | 1.645 | 0.050 |
| POSS C | 1.647 | 0.026 |
| POSS D | 1.689 | 0.205 |
| POSS A & D (4:1 wt/wt) | 1.735 | 0.278 |
| POSS B & D (4:1 wt/wt) | 1.762 | 0.308 |

Example 4

193 nm Lithography and Etching the Antireflective Hardmask Layer:

The hardmask layer was formed as described in Example 3 using the mixture of POSS A and POSS D. A layer of PAR 715 acrylic-based photoresist (obtained from Sumitomo) was spin-coated over the cured antireflective hardmask layer to a thickness of about 300 nm. The photoresist was baked at 130° C. for 60 seconds. The photoresist layer was then imaged using a 0.6 NA 193 nm Nikon Stepper with conventional and annular illumination using APSM reticle. After patternwise exposure, the photoresist layer was baked at 130° C. for 60 seconds. The image was then developed using commercial developer (0.26M TMAH). The resulting pattern showed 113.75 nm and 122.5 nm equal lines and space patterns.

The pattern was then transferred into the antireflective hardmask layer by a 20 second fluorocarbon based etch using a TEL DRM tool. The etch selectivity between the photoresist and the antireflective hardmask layer exceeded ten to one, demonstrating that virtually no photoresist is lost during the antireflective hardmask open etch.

The etch selectivity between the films present between the antireflective hardmask layer and an oxide containing material layer was determined on the polymer films from Example 3 to be 2.5 to one and 3.3 to one for the photoresist (PAR 715), respectively, using a fluorocarbon based etch performed on a TEL DRM tool. The combined etch selectivities give an overall etch selectivity of the pattern transfer from oxide to organic photoresist greater than 20 to one which is superior to any known organic hardmasks.

What is claimed is:

1. An antireflective hardmask composition comprising:
  a fully condensed polyhedral oligosilsesquioxane, $\{RSiO_{1.5}\}_n$, wherein n equals 8;
  at least one chromophore moiety and transparent moiety; and
  one or more of a crosslinking component and an acid generator, wherein the crosslinking component comprise at least one of an epoxide and an alcohol.

2. The composition of claim 1, comprising from about 50 wt % to about 98 wt. %, on a solids basis, polyhedral oligosilsesquioxane.

3. The composition of claim 1, comprising from about 70 wt % to about 80 wt. %, on a solids basis, polyhedral oligosilsesquioxane.

4. The composition of claim 1, wherein each chromophore moiety is selected from the group consisting of phenyl, chrysenes, pyrenes, fluoranthrenes, anthrones, benzophenones, thioxanthones, anthracenes, anthracene derivatives, 9-anthracene methanol, phenol thiazine, non-aromatic compounds containing unsaturated carbon to carbon double bonds, compounds containing saturated carbon to carbon bonds and compositions comprising at least one of the foregoing chromophotes.

5. The composition of claim 1, wherein each transparent moiety is substantially free of unsaturated carbon to carbon double bonds.

6. The composition of claim 1, wherein at least one transparent moiety comprises fluorine.

7. The composition of claim 1, wherein less than or equal to about 50 percent of the transparent moieties present are flee of unsaturated carbon to carbon bonds.

8. The composition of claim 1, wherein each transparent moiety is transparent to 157 nanometer radiation.

9. The composition of claim 1, comprising an equivalent number of chromophore and transparent moieties.

10. The composition of claim 1, wherein the crosslinking component is selected from the group consisting of epoxides, alcohols, aromatic alcohols, hydroxybenzyl, phenol, hydroxymethylbenzyl, cycloaliphatic alcohols, cyclohexanoyl, non-cyclic alcohols, fluorocarbon alcohols, aliphatic alcohols, amino groups, vinyl ethers and compositions comprising at least one of the foregoing crosslinking components.

11. The composition of claim 1, comprising less than or equal to about 50 wt. %, on a solids basis, crosslinking component.

12. The composition of claim 1, comprising from about five wt. % to about 25 wt. %, on a solids basis, crosslinking component.

13. The composition of claim 1, further comprising an additional an crosslinking component.

14. The composition of claim 13, wherein the additional crosslinking component is selected from the group consisting of glycoluril, methylated glycoluril, butylated glycoluril, tetramethoxymethyl glycoluril, methylpropyltetramethoxymethyl glycoluril, methylphenyltetramethoxymethyl glycoluril, 2,6-bis(hydroxymethyl)-p-cresol, etherified amino resins, methylated melamine resins, N-methoxymethyl-melamine, butylated melamine resins, N-butoxymethyl-melamine, bis-epoxies, bis-phenols, bisphenol-A, and compositions comprising at least one of the foregoing crosslinking components.

15. The composition of claim 1, wherein the acid generator is selected from the group consisting of 2,4,4,6-tetrabromocyclohexadienone, benzoin tosylate, 2-nitrobenzyl tosylate, alkyl esters of organic sulfonic acids, and combinations comprising at least one of the foregoing acid generators.

16. The composition of claim 1, wherein the acid generator is a thermal acid generator.

17. The composition of claim 1, comprising from about one wt. % to about 20 wt. %, on a solids basis, acid generator.

18. The composition of claim 1, comprising from about one wt. % to about 15 wt. %, on a solids basis, acid generator.

19. A method for processing a semiconductor device, the method comprising the steps of:
providing a material layer on a substrate;
forming an antireflective hardmask layer over the material layer, the antireflective hardmask layer comprising:
a fully condensed polyhedral oligosilsesquioxane, $\{RSiO_{1.5}\}_n$, wherein n equals 8;
at least one chromophore moiety and transparent moiety; and
one or more of a crosslinking component and an acid generator, wherein the crosslinking component comprises at least one of an epoxide and an alcohol.

20. The method of claim 19, further comprising the steps of:
forming a radiation-sensitive imaging layer over the antireflective hardmask layer;
patternwise exposing the radiation-sensitive imaging layer to radiation thereby creating a pattern of radiation-exposed regions in the imaging layer;
selectively removing portions of the radiation-sensitive imaging layer and the antireflective hardmask layer to expose portions of the material layer; and
etching the exposed portions of the material layer, thereby forming a patterned material feature on the substrate.

21. The method of claim 20, further comprising the step of removing remaining radiation-sensitive imaging layer and antireflective hardmask layer from the material layer.

22. The method of claim 20, wherein the radiation is ultraviolet radiation having a wavelength of less than or equal to about 200 nanometers.

23. The method of claim 20, wherein the radiation is electron beam radiation.

24. The method of claim 19, wherein the material layer comprises a material selected from the group consisting of a conductive material, a semiconductive material, a magnetic material, an insulative material, a metal, a dielectric material and combinations comprising at least one of the foregoing materials.

25. The method of claim 19, wherein the material layer comprises at least one of an oxide, a nitride, a poly silicon and a chrome.

26. The method of claim 19, wherein the antireflective hardmask layer has a thickness of from about 0 03 micrometers to about five micrometers.

27. The method of claim 19, wherein the forming step comprises the step of baking the antireflective hardmask layer.

28. A patterned lithographic structure, comprising:
a substrate;
a material layer over the substrate;
a patterned antireflective hardmask layer over the material layer, the patterned antireflective hardmask layer comprising:
a fully condensed polyhedral oligosilsesquioxane, $\{RSiO_{1.5}\}_n$, wherein n equals 8;
at least one chromophore moiety and transparent moiety;
one or more of a crosslinking component and an acid generator wherein the crosslinking component comprises at least one of an epoxide and an alcohol; and
a patterned radiation-sensitive imaging layer over the antireflective hardmask layer.

29. An antireflective hardmask composition comprising:

a plurality of fully condensed polyhedral oligosilsesquioxane units, $\{RSiO_{1.5}\}_n$, wherein n equals 8;

chromophore moieties present on horn about five percent to about 40 percent of the polyhedral oligosilsesquioxane units;

transparent moieties in a number equivalent to the chromophore moieties; and one or more of a crosslinking component and an acid generator, wherein the crosslinking component comprises at least one of an epoxide and an alcohol.

* * * * *